(12) United States Patent
Lin et al.

(10) Patent No.: US 9,119,315 B2
(45) Date of Patent: Aug. 25, 2015

(54) SERVER WITH OPENINGS ON TWO LATERAL SIDES

(71) Applicant: Super Micro Computer Inc., San Jose, CA (US)

(72) Inventors: Te-Chang Lin, San Jose, CA (US); Tony Chuen-Yiu Cheng, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 370 days.

(21) Appl. No.: 13/745,747

(22) Filed: Jan. 19, 2013

(65) Prior Publication Data

US 2014/0204540 A1  Jul. 24, 2014

(51) Int. Cl.
*H05K 7/14* (2006.01)

(52) U.S. Cl.
CPC ..................................... *H05K 7/1488* (2013.01)

(58) Field of Classification Search
CPC ... H05K 5/0221; H05K 5/023; H05K 7/1401; H05K 7/1415; H05K 7/1488; G06F 1/186; G06F 1/187; G11B 33/125; G11B 33/127; G11B 33/128; A47B 2210/0059
See application file for complete search history.

(56) References Cited

U.S. PATENT DOCUMENTS

| | | | | |
|---|---|---|---|---|
| 6,418,011 | B2 * | 7/2002 | Omori | 361/679.33 |
| 7,894,208 | B1 * | 2/2011 | Lin | 361/796 |
| 7,944,700 | B2 * | 5/2011 | Wang et al. | 361/727 |
| 8,369,081 | B2 * | 2/2013 | Chen | 361/679.39 |
| 8,570,751 | B2 * | 10/2013 | Zhou | 361/726 |

* cited by examiner

*Primary Examiner* — Jerry Wu
*Assistant Examiner* — Christopher L Augustin
(74) *Attorney, Agent, or Firm* — Chun-Ming Shih; HDLS IPR SERVICES

(57) ABSTRACT

A server for shortening development schedule is disclosed. A case has two tray receiving spaces. Each tray receiving space has a first opening and a second opening. Power sockets are disposed at the same position in the tray receiving spaces correspondingly. A storage unit includes a tray, a mother board and a storage component. The tray is inserted to the tray receiving space from the first opening and disposed extending to the opposite second opening. The storage unit is electrically connects with the power socket and fixed in the tray receiving space through a locking structure.

11 Claims, 10 Drawing Sheets

SERVER WITH OPENINGS ON TWO LATERAL SIDES

BACKGROUND OF THE INVENTION

1. Field of the Invention

The present invention generally relates to a server and, in particular to a server with openings on two lateral sides.

2. Description of Related Art

In response to needs for accessing a large number of electronic information, pluralities of stacked trays are arranged in server cases nowadays. Storage components are carried in each tray, and each of the trays can be removed or installed independently. Thus it will be more convenient for maintenance and easy for expanding and upgrading of the system in the future.

However, existing servers have various specifications corresponded to using in different environments and different requirements. Therefore, the server industry will provide many customized servers depended on different requirements for users, for example, opening locations, quantity and insert locations of trays of severs. According to servers with different configurations usually need different specifications of cases and trays, the developing schedule must be extended for various specifications of cases and trays. Hence the cost will be increased significantly In view of the above drawbacks, the Inventor proposes the present invention based on his expert knowledge and elaborate researches in order to solve the problems of related art.

SUMMARY OF THE INVENTION

Accordingly, an object of the present invention is to provide a server with openings on two lateral sides, in which two ends of the tray receiving space of the case are fully opened openings. It can provide a design option for storage units removed from any of the openings, and the input/output port can be provided at any of the openings. Thus the developing schedule will be shortened and the cost will be reduced.

In order to achieve the object mentioned above, the present invention provides a server with openings on two lateral sides comprising a case, a partition plate, a plurality of power sockets and at least one storage unit. The case has a bottom plate and two side plates extending perpendicularly from sides of the bottom plate. The bottom plate and two side plates are arranged to define an accommodating space. The partition plate is disposed uprightly between the side plates and separating the accommodating space into two tray receiving spaces in parallel, and each of the tray receiving spaces of the case has a plurality of rails. One end of the tray receiving space of the case is defined a first opening, and the other end is defined a second opening, wherein the first opening and the second opening are fully opened openings. Power sockets are disposed at the second opening, and each power socket is located at the same position in the tray receiving space correspondingly. The storage unit includes a tray, a mother board disposed on the tray, a storage component electrically connected with the mother board. The tray is provided with a locking structure and inserted to the tray receiving space from the first opening and disposed extending to the opposite second opening along the rails. The storage unit is electrically connected with the power socket correspondingly and fixed in the tray receiving space through the locking structure.

Comparing to the related art, the accommodating space of the case is separated into two tray receiving spaces. One end of the tray receiving space of the case is a first opening and the other end is a second opening. The tray of the storage unit can insert to the tray receiving space from the first opening and disposed extending to the opposite second opening. As two ends of the tray receiving space of the case are both fully opened openings, a design option is provided for the storage unit removed from any of the openings, and the input/output port can be provided at any of the openings. Thus this sever configuration can be implemented in various models, and the tooling number of the case will be reduced. Moreover, the storage unit of the present invention can be inserted in the tray receiving spaces as demands, and the tooling number of the tray will be reduced for lowering the cost of the server.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 1:
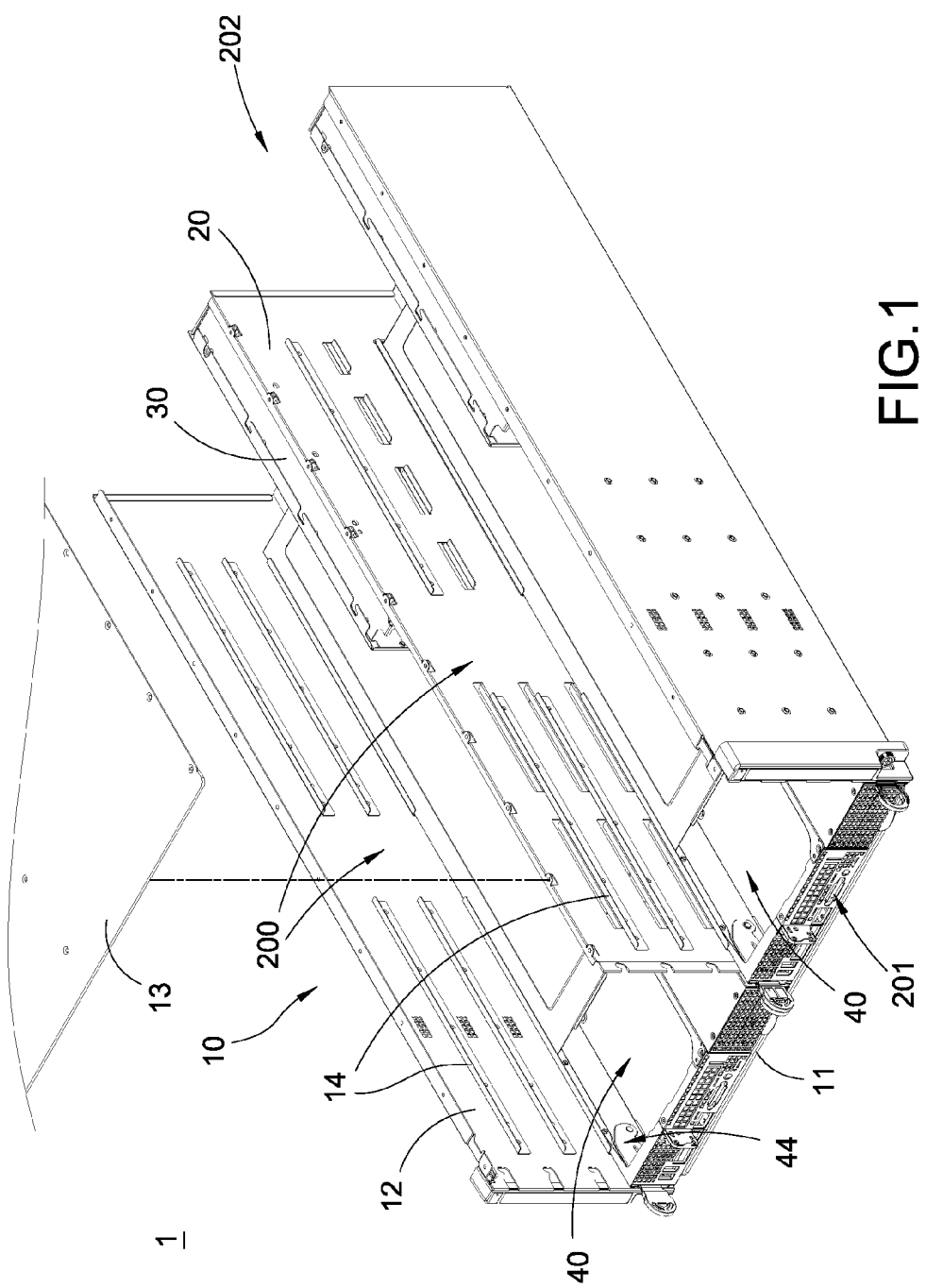
FIG. 1 is a perspective schematic view according to the present invention.
Figure 2:
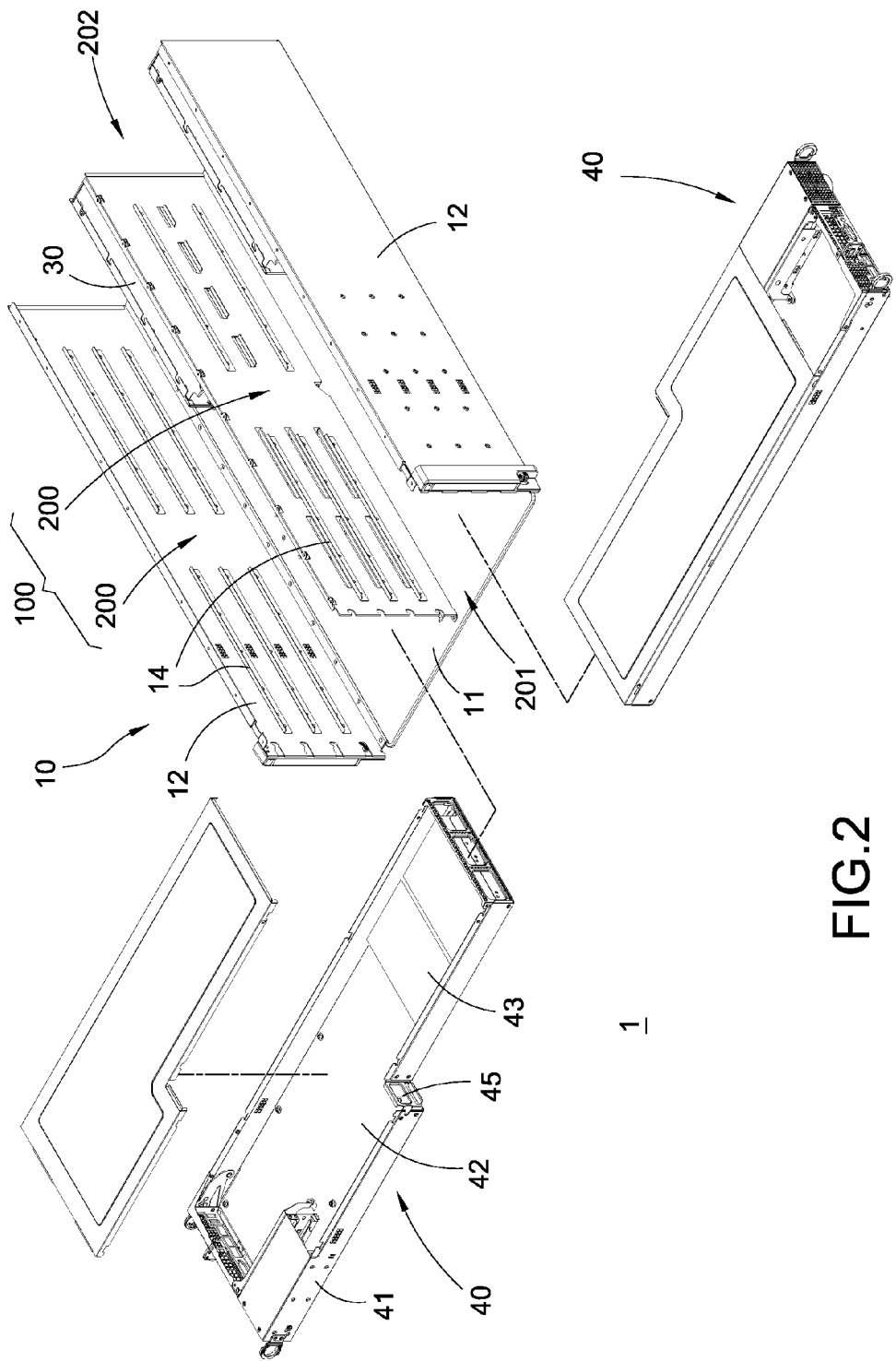
FIG. 2 is a perspective exploding view according to the present invention.
Figure 3:
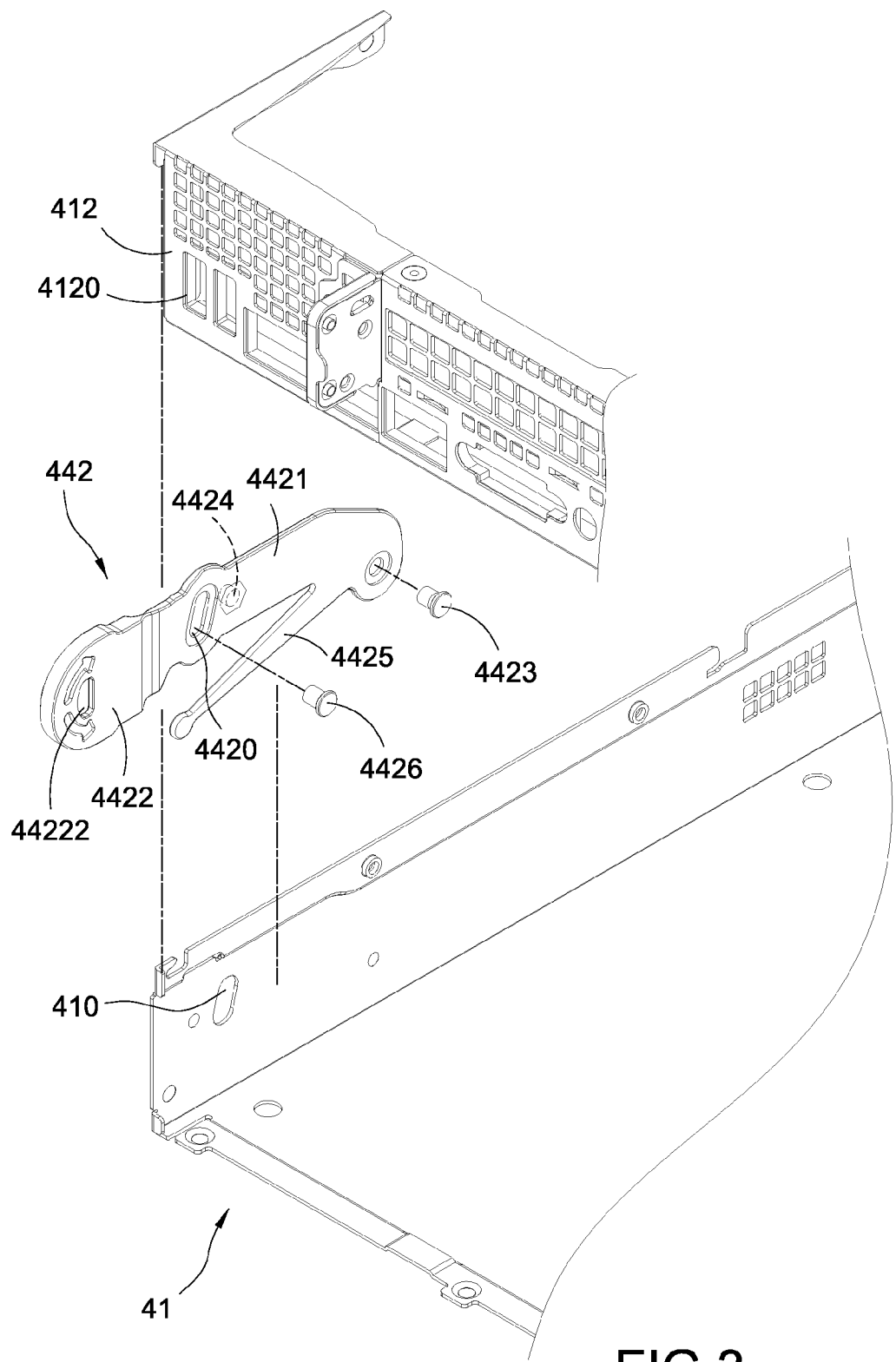
FIG. 3 is a partial perspective exploding view of the tray according to the present invention.
Figure 4:
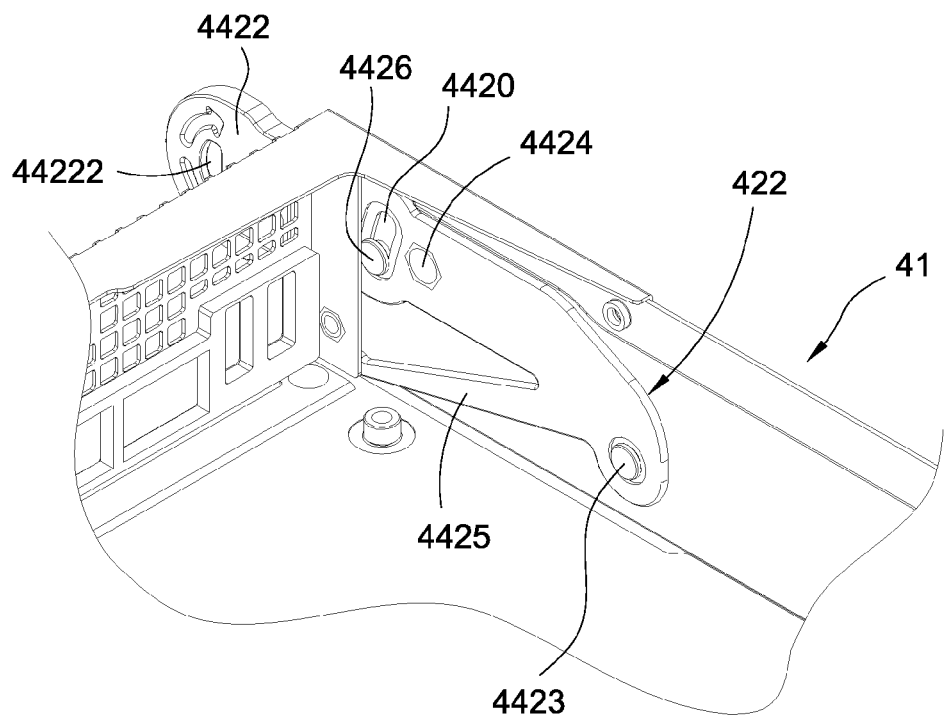
FIG. 4 is a partial perspective assembly view of the tray according to the present invention.

Please refer to FIG. 1 and FIG. 2, they depict a perspective schematic view and a perspective exploding view of the present invention. The present invention discloses a server 1 with openings on two lateral sides. The server 1 includes a case 10, a partition plate 20, a plurality of power sockets 30 and at least one storage unit 40. The partition plate 20 is fixed in the case 10. The power sockets 30 and the storage unit 40 are disposed in a space defined by the case 10 and the partition plate 20.

The case 10 has a bottom plate 11 and two side plates 12 extending perpendicularly from sides of the bottom plate 11 respectively and a top plate 13. The bottom plate 11 and the two side plates 12 are arranged to define an accommodating space 100. The top plate 13 covers one side of the accommodating space 100.

The partition plate 20 disposed uprightly between the two side plates 12 and separates the accommodating space 100 into two tray receiving spaces 200 in parallel, and each of the tray receiving spaces 200 of the case 10 has a plurality of rails 14. A first opening 201 is defined at one end of the tray receiving space 200 of the case 10, and a second opening 202 is defined at the other end of the tray receiving space 200 of the case 10. The first opening 201 and the second opening 202 are of the same size, and the first opening 201 and the second opening 202 are fully opened openings. In other words, there is no any shelter, such as fans or covering plates, disposed at the first opening 201 or the second opening 202.

In an embodiment of the present embodiment, the rails 14 are disposed in symmetrically and arranged at interval on inner walls of the side plates 12 and two side faces of the partition plate 20. Preferably, the two side plates 12 and the front side and the back side of the partition plate 20 are provided with plural rails 14 for the movement of the storage unit 40 moving thereon.

The power sockets 30 are disposed at the second opening 202, and each power socket 202 is located at the same position in the tray receiving space 200 correspondingly. In this manner, the storage unit 40 can insert in any of the two tray accommodating regions 200 for changing inserting positions of the storage unit 40 by demands of users.

It is worth notice that when the storage unit 40 is inserted to the tray receiving space 200 from the first opening 201, the power sockets 30 are located at the second opening 202. On the contrary, when the storage unit 40 is inserted to the tray receiving space 200 from the second opening 202, the power sockets 30 are located at the first opening 202.

The storage unit 40 includes a tray 41, a mother board 42 disposed on the tray 41, and a storage component 43 electrically connected with the mother board 42. One side of the tray 41 is provided with a locking structure 44.

The tray 41 is inserted to the tray receiving space 200 from the first opening 201 and disposed extending to the opposite second opening 202 along the rails 14. More specifically, when the tray 41 is inserted to the tray receiving space 200 from the first opening 201, the end of the tray 41 is located at the second opening 202. Similarly, when the tray 41 is inserted to the tray receiving space 200 from the second opening 202, the end of the tray 41 is located at the first opening 201.

Furthermore, when the storage unit 40 is inserted in the tray receiving space 200, the storage unit 40 will be electrically connected with the power socket 30 correspondingly and fixed in the tray receiving space 200 through the locking structure 44.

Please refer to the FIG. 3 to FIG. 6, they depict a partial perspective exploding view, a partial perspective assembly view, a partial perspective schematic view, and a plan view of the tray of the present invention. The locking structure 44 (with reference also to FIG. 1) is provided at a side of the tray 41 and the locking structure 44 has at least one first positioning slot 441 and a pull plate 442 being retainable in the first positioning slot 441.

Preferably, the first positioning slot 441 is located on the side plate 12, and the pull plate 442 is provided on an inner wall of the tray 41. Moreover, the pull plate 442 includes a positioning sheet 4421, a flexible pull-ring 4422 connecting with the positioning sheet 4421, a pivot 4423 passing through the positioning sheet 4421, a pillar 4424 fixed on the positioning sheet 4421 and an elastic arm 4425

In the present invention, the pivot 4423 is combined in a lateral wall of the tray 41 for acting as a rotation fulcrum of the pull plate 442. Besides, a lateral wall of the tray 41 is provided with a trough 410, and the pillar 4424 passing through the trough 410 is movable in the first positioning slot 441 (the position of the pillar 4424 and the first positioning slot 441 will be described later). The elastic arm 4425 located in a lateral side of the positioning sheet 4421 abuts resiliently against an inner wall of the tray 41.

Furthermore, the pull plate 442 further includes a limiting slot 4420 and a limiting column 4426. When the pull plate 442 rotates, the limiting column 4426 is selectively positioned at two ends of the limiting slot 4420 for preventing pull plate 442 from excessive rotation. Further descriptions of the flexible ring-pull 4422 is as following.

Figure 5:
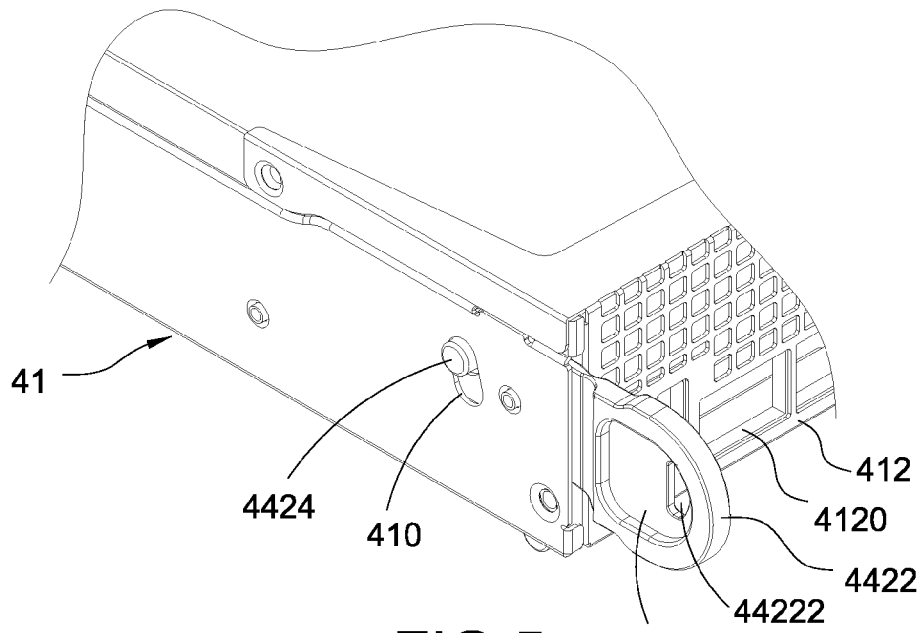
FIG. 5 is a partial perspective schematic view of the tray according to the present invention.

As shown in FIG. 5, in the present invention, one side of the flexible pull-ring 4422 has a concave area 44221, and a penetrating hole 44222 is provided in the concave area 44221. Because the flexible pull-ring 4422 is elastically deformable, flexible pull-rings 4422 of two trays 41 will be overlapped when two parallel storage units 40 are inserted to. In this time, users can slightly flip one of the flexible pull-rings 4422 for separating the overlapped flexible ring-pulls 4422, and then users can snap into the flexible pull-rings 4422 of the tray 41 with fingers respectively for pulling out the storage units 40.

Figure 6:
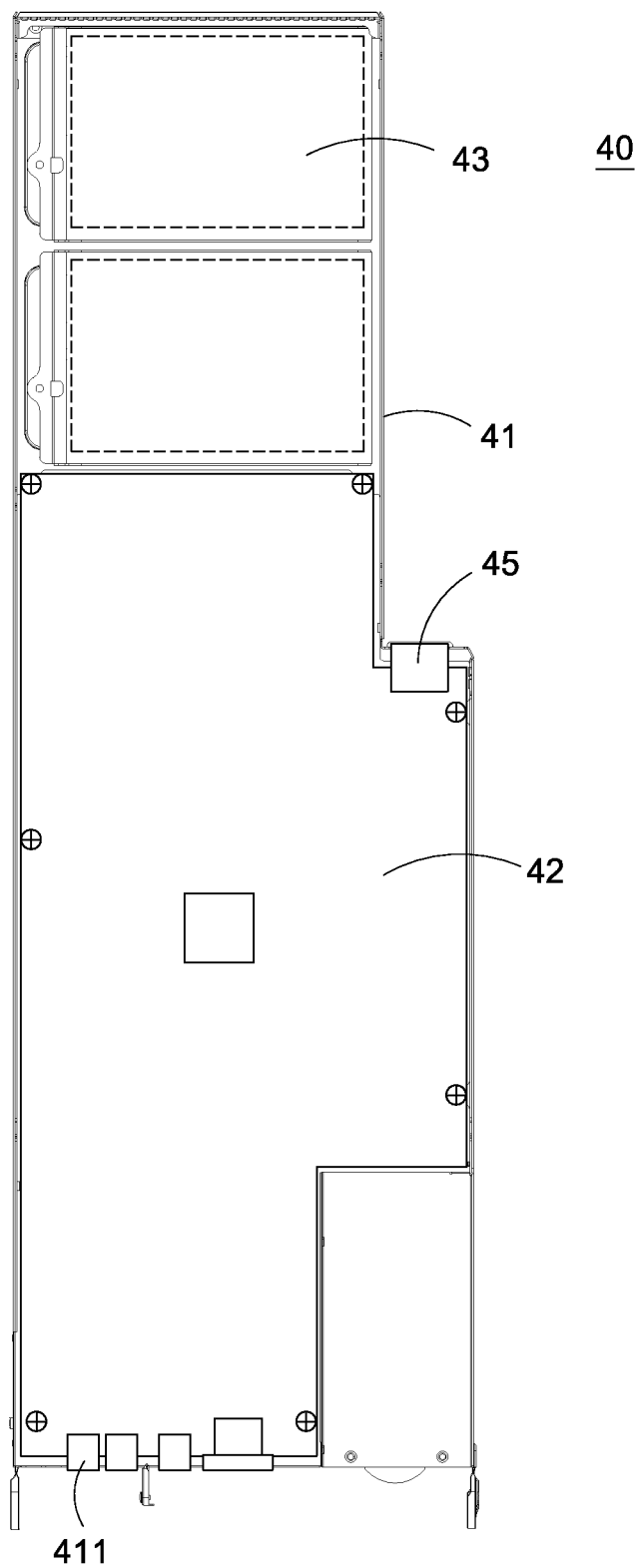
FIG. 6 is a plan view of the tray according to the present invention.

Please refer to FIG. 6, in an embodiment of the present invention, the tray 41 has a power connector 45 electrically connected with the mother board 41. The power connector 45 is plugged in the power socket 30 when the storage unit 40 is inserted to the tray receiving space 200 (refer to FIG. 2). In addition, one lateral side of the tray 41 is provided with an input/output port 411, and the input/output port 411 is electrically connected with the mother board 42. Therefore, a shielding sheet 412 is disposed on the tray 41 with respect to the input/output port 411, and the shielding sheet 412 has a plurality of slots 4120 corresponding to the input/output port 411 (Please refer to FIG. 3).

Figure 7:
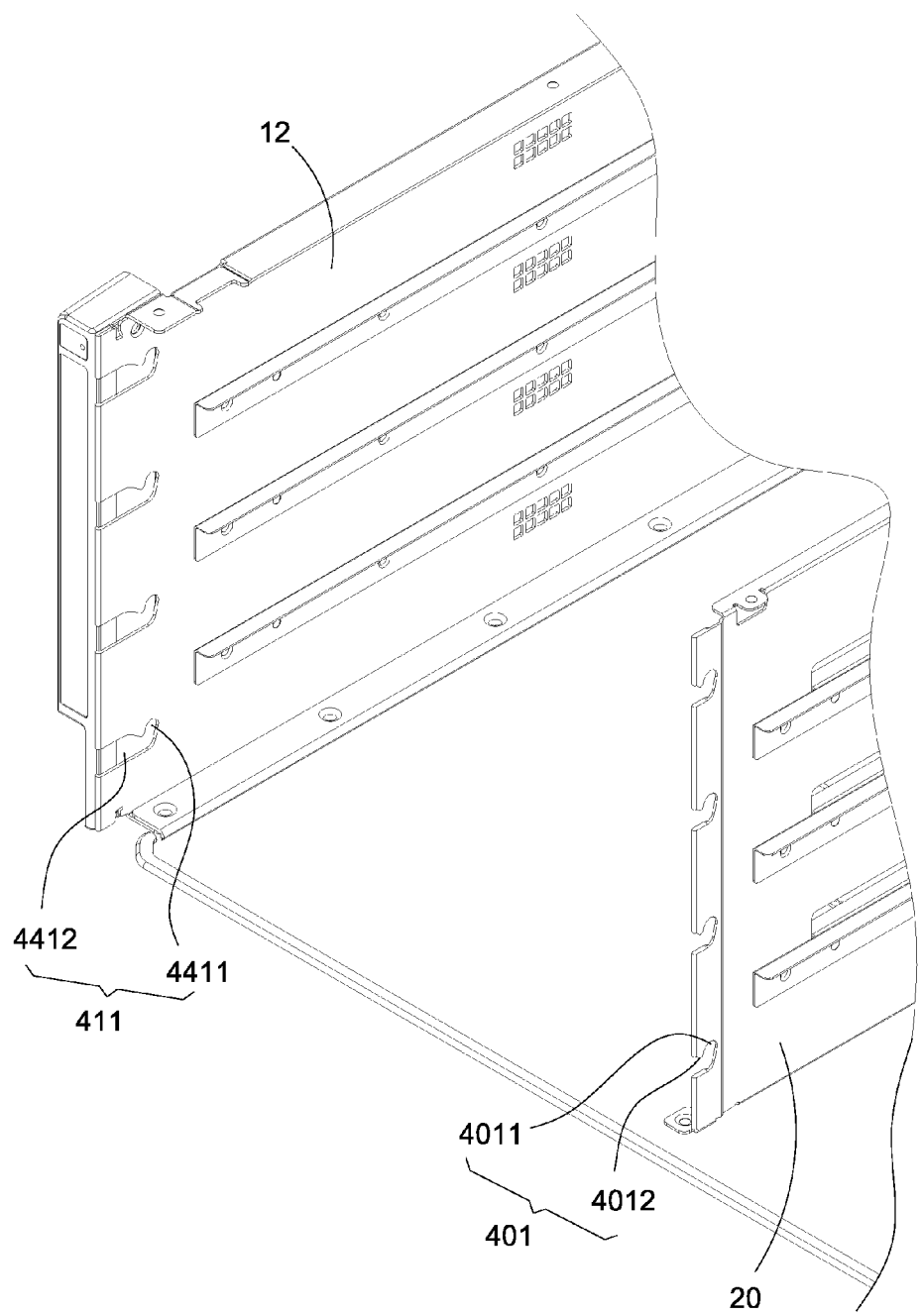
FIG. 7 is a partial perspective schematic view of the case according to the present invention.

Please refer to the FIG. 7, it depicts a partial perspective schematic view of the case of the present invention. As shown in the figure, the first positioning slot 441 is located on a lateral end of the side plate 12. In the embodiment, the first positioning slot 441 is located on the side plate 12 near the first opening 201. The first positioning slot 441 includes a first buckling hole 4411 and a first sliding slot 4412 connecting to the first buckling hole 4411. Besides, one end of the partition 20 is provided with a second positioning slot 21 corresponding to the first positioning slot 441. The second positioning slot 21 includes a second buckling hole 211 and a second sliding slot 212 connecting to the second buckling hole 211. It is worth notice that the second buckling hole 211 is at the same level with the first buckling hole 4411, and the size of the second sliding slot 212 is slightly shorter than that of the first sliding slot 4412.

Figure 8:
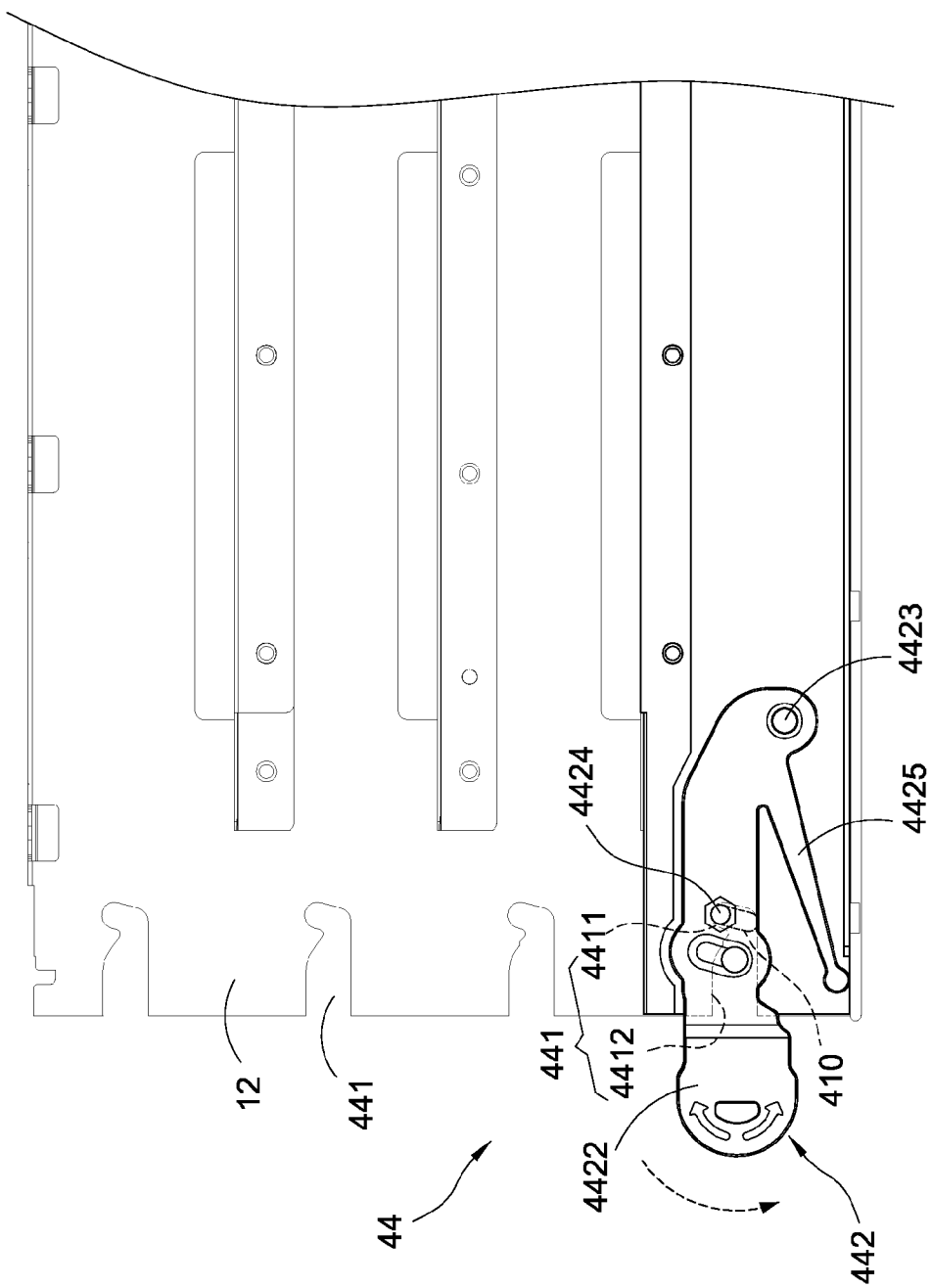
FIG. 8 is an operating state of the locking structure according to the present invention.
Figure 9:
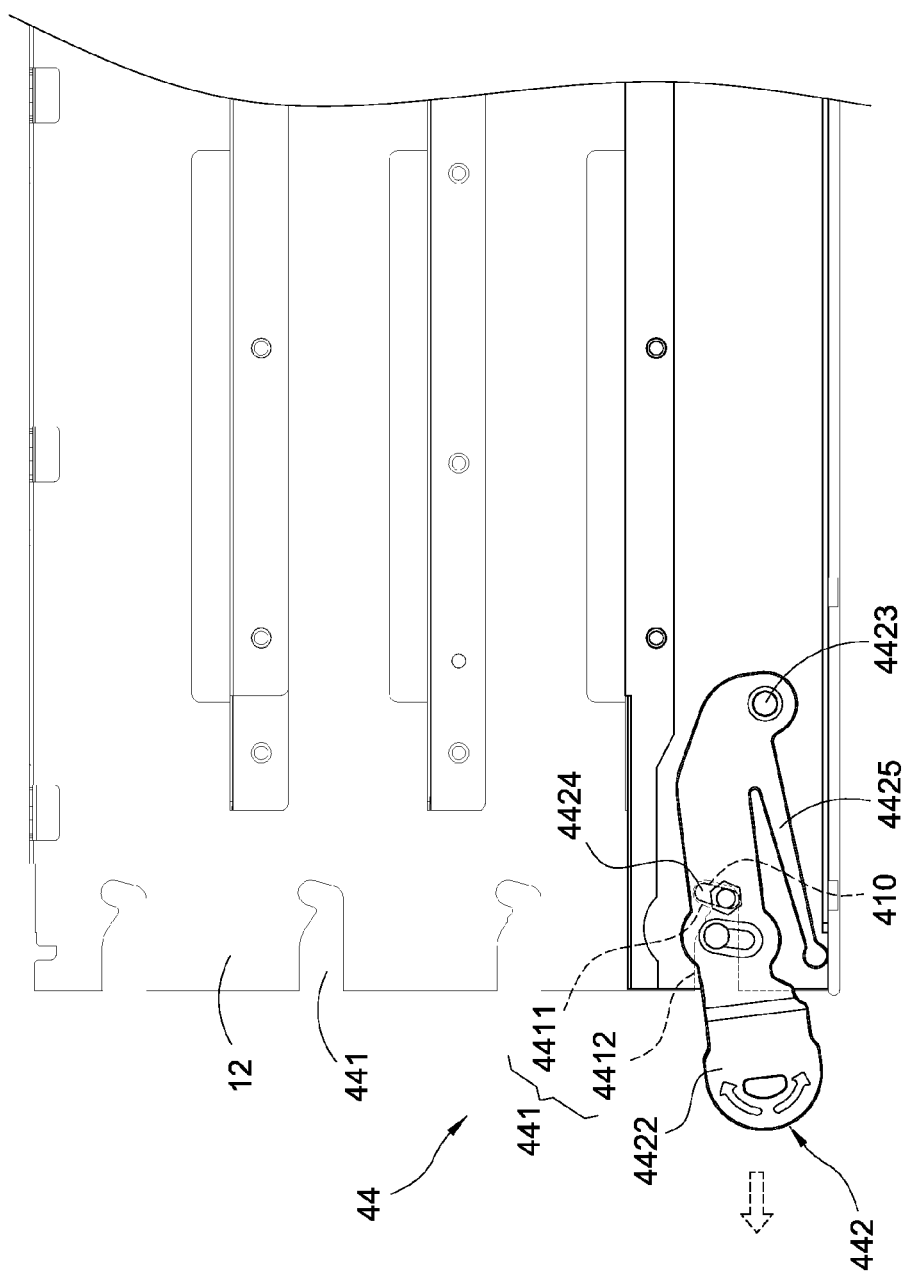
FIG. 9 is another operating state of the locking structure according to the present invention.
Figure 10:
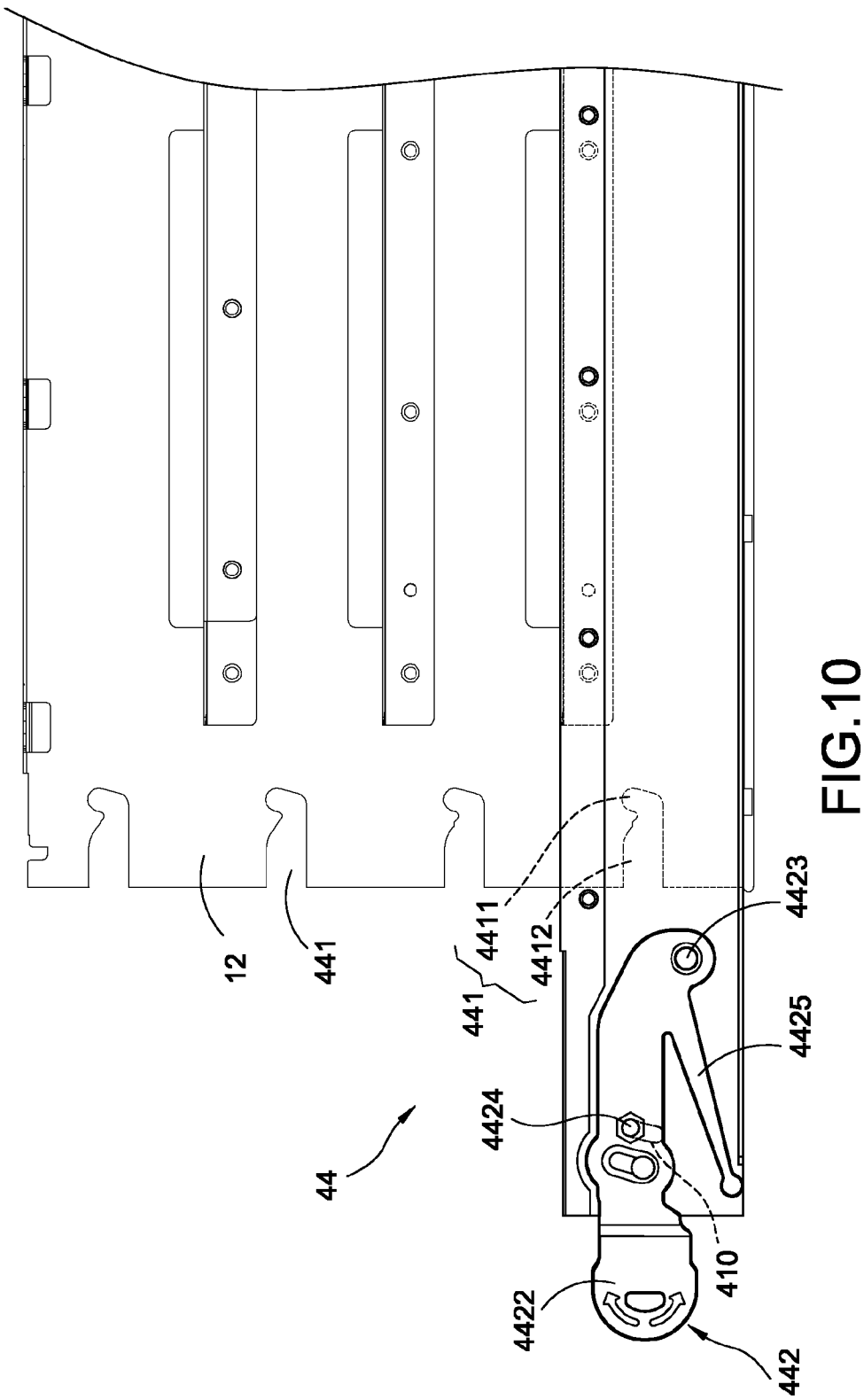
FIG. 10 is a further operating state of the locking structure according to the present invention.

Please further refer to the FIG. 8 to FIG. 10, they depict operating states of the locking structure of the present invention. As shown in FIG. 8, the pillar 4424 passing through the trough 410 is positioned in the first buckling hole 4411 of the first positioning slot 441 when the locking structure 44 is locked. In this way, the storage unit 40 will be fixed in the tray receiving space 200 by the locking structure 44. That is, the locking structure 44 must be out of the lock positioning for taking out the storage unit 40.

Please refer to the FIG. 9 and FIG. 10, the flexible pull-ring 4422 must be pushed down and rotated when the storage unit 40 is to be taken out. The pull plate 442 takes the pivot 4423 as a fulcrum and rotates downward. The pull plate 442 brings the pillar 4424 out of the positioning of the first buckling hole 4411, and then pulls the pull plate 442. The pillar 4424 will move out along the first sliding slot 4412, thus the storage unit 40 will be removed. Similarly, when users push the storage unit 40 in, the pillar 4424 moves inward along the first sliding slot 4412 firstly, and then the pillar 224 is positioned upward in the first buckling hole 4411 through the resilient push of the elastic arm 4425. Accordingly, the storage unit 40 is positioned.

Figure 11:
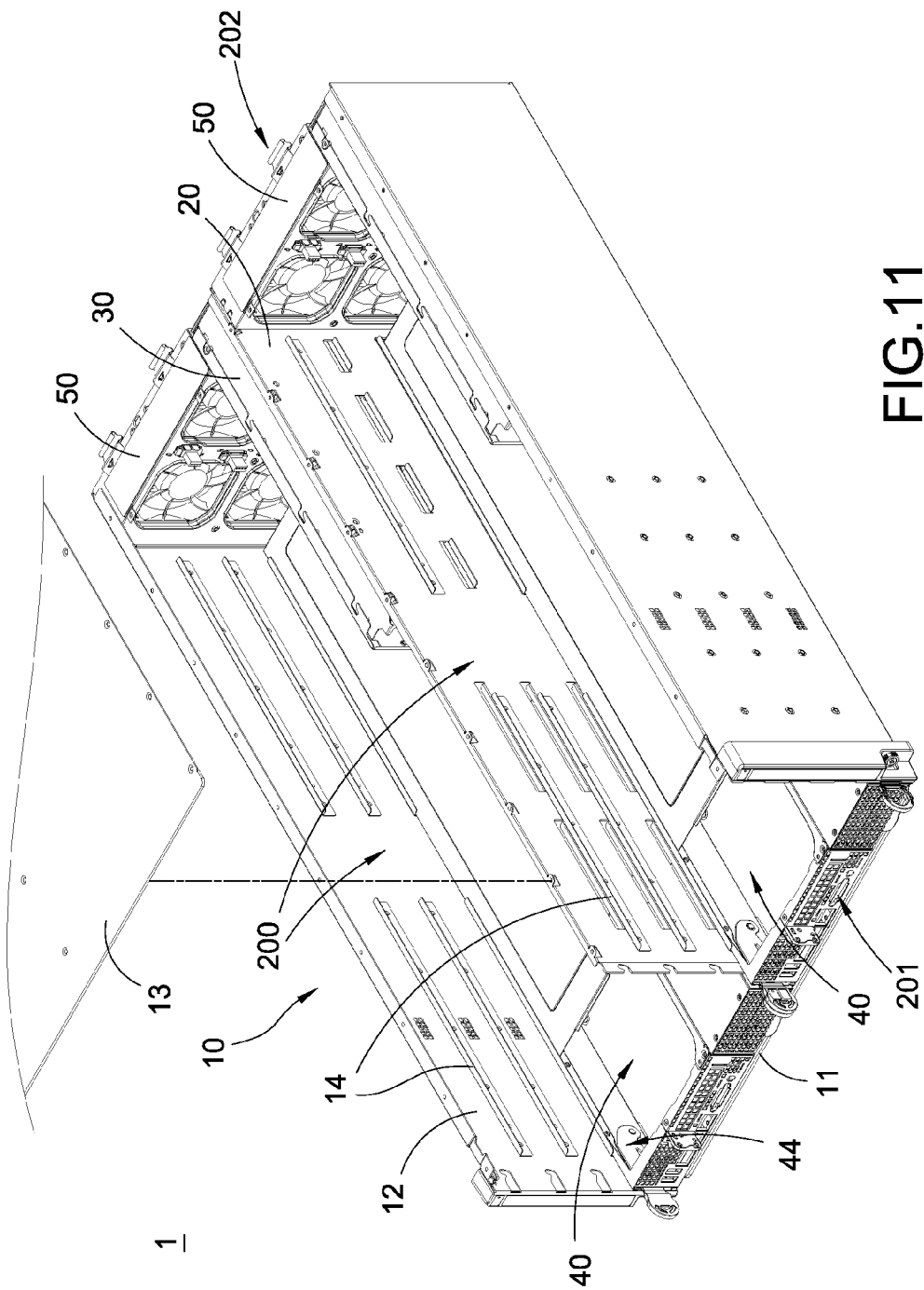
FIG. 11 is an application view of the server according to the present invention.

With refers to the FIG. 11, it depicts an application schematic view of sever of the present invention. The server 1 of the present invention further includes a set of fan 50, and the set of the fan 50 is attached at the second opening 202 corresponding to the storage unit 40. In an embodiment of the present invention, the set of fan 50 is located at the second opening 202 but not limited to.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. A server with openings on two lateral sides, comprising:
a case having a bottom plate and two side plates extending perpendicularly from sides of the bottom plate, the bottom plate and two side plates arranged to define an accommodating space;
a partition plate disposed uprightly between the two side plates and separating the accommodating space into two tray receiving spaces in parallel, each of the tray receiving spaces of the case having a plurality of rails, one end of the tray receiving space of the case defining a first opening and the other end of the case defining a second opening, the first opening and the second opening being fully opened openings;
a plurality of power sockets disposed at the second opening, each power socket located at a same position in the tray receiving space correspondingly; and
at least one storage unit including a tray, a mother board disposed on the tray, a storage component electrically connected with the mother board, the tray provided with a locking structure inserted to the tray receiving space from the first opening and disposed extending to the opposite second opening along the rails, the storage unit electrically connected with the power socket correspondingly and fixed in the tray receiving space through the locking structure,
wherein the locking structure is provided in a side of the tray, the locking structure has at least one first positioning slot, and a pull plate is retainable in the first positioning slot,
wherein the first positioning slot is located on the side plate and the pull plate is provided on an inner wall of the tray,
wherein the pull plate includes a positioning sheet, a flexible pull-ring connecting with the positioning sheet, a pivot passing through the positioning sheet and a pillar fixed on the positioning sheet, and the pivot is combined in a lateral wall of the tray,
wherein a lateral wall of the tray is provided with a trough, the pillar passes through the trough and moves in the first positioning slot, and
wherein the first positioning slot includes a first buckling hole and a first sliding slot connecting to the first buckling hole, the pillar is movable in the first sliding slot and positioned in the first buckling hole.

2. The server according to claim 1, wherein the rails are disposed symmetrically and arranged at interval on inner walls of the side plates and two side faces of the partition plate.

3. The server according to claim 1, wherein one end of the partition is provided with a second positioning slot corresponding to the first positioning slot.

4. The server according to claim 1, wherein the pull plate further includes a limiting slot and a limiting column, the limiting column is selectively positioned at two ends of the limiting slot.

5. The server according to claim 1, wherein the pull plate further includes an elastic arm, the elastic arm located in a lateral side of the positioning sheet and abutting resiliently against an inner wall of the tray.

6. The server according to claim 1, wherein one side of the flexible pull-ring is provided with a concave area, a penetrating hole is provided in the concave area.

7. The server according to claim 1, wherein one lateral side of the tray is provided with an input/output port, the input/output port is electrically connected with the mother board.

8. The server according to claim 7, wherein a shielding sheet is disposed on the tray with respect to the input/output port, and the shielding sheet has a plurality of slots corresponding to the input/output port.

9. The server according to claim 1, wherein the tray has a power connector electrically connected with the mother board, the power connector is plugged in the power socket.

10. The server according to claim 1, wherein the case further includes a top plate, the top plate covers one side of the accommodating space.

11. The server according to claim 1, further including a set of fan, the set of the fan is attached at the second opening corresponding to the storage unit.

* * * * *